United States Patent [19]

Grace et al.

[11] 3,743,966

[45] July 3, 1973

[54] TRAPATT DIODE TRANSMISSION LINE OSCILLATOR USING TIME DELAYED TRIGGERING

[75] Inventors: Martin I. Grace, Framingham; Harold J. Pratt, Jr., Andover, both of Mass.

[73] Assignee: Sperry Rand Corporation, New York, N.Y.

[22] Filed: Feb. 9, 1972

[21] Appl. No.: 224,787

[52] U.S. Cl. .............................. 331/101, 331/107 R
[51] Int. Cl. .............................................. H03b 7/14
[58] Field of Search .............. 331/96.99, 101, 107 R

[56] References Cited

UNITED STATES PATENTS 3,559,097 1/1971 Chang et al. .................... 331/101 X
3,646,357 2/1972 Grace .................................. 331/96

OTHER PUBLICATIONS

Prager et al., Proceedings of the IEEE, April 1967, pp. 586–587.

*Primary Examiner*—Roy Lake
*Assistant Examiner*—Siegfried H. Grimm
*Attorney*—Howard P. Terry

[57] ABSTRACT

An active high-efficiency-mode semiconductor diode is coupled for the generation of oscillating high frequency electromagnetic fields in a transmission line network, the apparatus taking the form of a single port, high frequency oscillator device. Oscillations are sustained by using the time delayed triggering phenomenon in the TRAPPAT semiconductor diode.

8 Claims, 8 Drawing Figures

PATENTED JUL 3 1973 3,743,966

SHEET 1 OF 3

TRAPATT DIODE TRANSMISSION LINE OSCILLATOR USING TIME DELAYED TRIGGERING

BACKGROUND OF THE INVENTION

1. Field of the Invention

The invention pertains to high frequency transmission line semiconductor diode oscillators, and more particularly relates to means in such semiconductor energy converter devices for efficiently sustaining oscillations therein.

2. Description of the Prior Art

Prior art high-efficiency-mode diode oscillators have made beneficial use of time delayed triggering phenomena for the generation of high frequency or microwave oscillations. The action of the time delayed triggering phenomenon in a conventional diode oscillator has been explained as follows. Where a short circuit is placed roughly a half wave distance ($\lambda/2$) at the mid-operating fundamental frequency from the diode, consider that a transient over-voltage sufficient in magnitude to initiate a traveling avalanche zone is placed across the diode. The over-voltage may be an accidental noise impulse, or may be introduced when a suitable signal is deliberately coupled into the device. While the consequent avalanche zone travels across the depletion region of the diode, the voltage across the diode drops. When the avalanche zone front has completely crossed the diode, the instantaneous voltage on the diode is substantially zero. Accordingly, a short duration voltage pulse is generated at the diode whose magnitude is substantially equal to the diode break-down voltage. This short duration voltage pulse cannot do else than propagate down the transmission line in which the diode is connected. Upon reaching the effective short circuit place substantially a half wave distance from the diode, the traveling pulse is inverted and is reflected to arrive back at the diode with a total time delay of $\lambda/c$, where c is the velocity of propagation within the transmission line. The delayed pulse instantaneously drives the voltage across the diode to about twice its breakdown voltage, thus pre-triggering another avalanche shock wave within the diode. Such an event permits the entire process repeatedly to cycle.

For high-efficiency-mode oscillators, time delayed triggering may beneficially be a major source of steady state oscillations. However, prior art oscillator circuits utilizing the phenomenon have not proved to be optimum in design. Many such coaxial or hollow wave guide circuits have proven to be difficult to make and to adjust at increasingly high carrier frequencies because of their small size. The problems associated with devising suitable means of independently matching, tuning, and otherwise adjusting the individual parts of the circuit in which fundamental and harmonic signals mutually or separately flow become increasingly difficult. Prior art oscillator circuits have not generally offered ease of tuning or of design for operation at a specific frequency of operation. Past tuning arrangements have not assured optimum coupling in proper relative phase and amplitude of the fundamental and harmonic energies to the diode. Furthermore, the diode circuits, when pulse operated, have displayed a significantly excessive leading edge jitter.

SUMMARY OF THE INVENTION

The invention is a high frequency or microwave diode oscillator device operating in a time delayed trigger mode transmission line network and employing a high-efficiency-mode active diode device. A unidirectional potential is applied across the high-efficiency-mode diode such that it is biased above the avalanche break down level. Any voltage signal, when superimposed upon the bias potential, produces large changes in the instantaneous diode voltage and current, which changes are characteristic of time-delayed-triggered oscillations. The consequent current wave contains many harmonic components of the fundamental oscillation frequency. The use of independent impedance adjustment at each harmonic produces an optimum current wave form, thereby improving the conversion efficiency of the diode. The frequency of the fundamental oscillation is largely determined by the electrical length of a shorted section of transmission line, offering essentially independent frequency adjustment. Substantially independent tuning of harmonics is also afforded.

DESCRIPTION OF THE PREFERRED EMBODIMENTS

There has often been employed in the past, in the study of high efficiency mode diode high frequency oscillators, a convenient but general equivalent circuit model which has apparently successfully described many observed results. The model (FIG. 1) has been found to have a degree of validity, even though it is a lumped constant model representing a device properly characterized by distributed parameters and operating in the presence of harmonics in a wide range of frequencies in a manner not strictly representable by a particular lumped constant configuration at all such participating frequencies.

Figure 1:
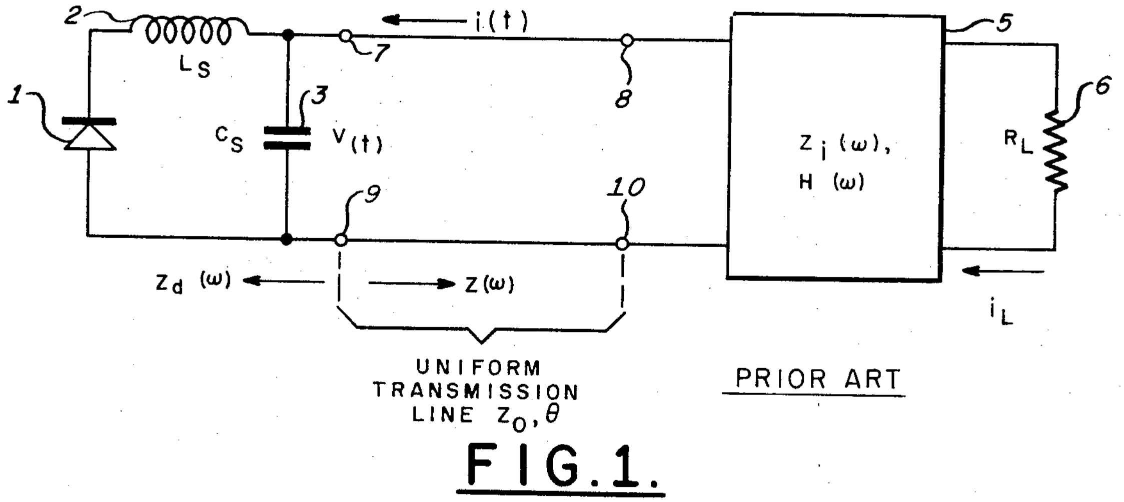
FIGS. 1 and 2 are equivalent circuits useful in explaining operation of time delay triggered high frequency oscillators.

The equivalent circuit model of FIG. 1 illustrates a high frequency oscillator diode package including a diode 1 having package parasitics including a series lead inductance 2 of value $L_s$ and a shunt package capacitance 3 of value $C_s$. Looking to the right in the figure from the diode package terminals 7 and 9, the basic circuit of the oscillator is composed of a section of uniform transmission line 4 ending at a plane containing terminals 8 and 10 where it is connected in cascade with microwave filter network 5 and a load 6 of value $R_L$. The section of uniform transmission line 4 is characterized by an electrical length $\theta$ and a characteristic impedance $Z_0$. Filter network 5 is characterized by an input impedance $Z_i(\omega)$ and a filter transfer function $H(\omega)$. The diode terminal impedance $Z_D(\omega)$, including the effects of the diode parasitic series lead inductance $L_s$ and shunt package capacitance $C_s$, may be described by the equation:

$$Z_D(\omega) = R_D(\omega) + jX_D(\omega)$$

where $R_D$ is the resistive part of the impedance of diode 1 and $X_D$ is the reactive part.

In the operation of high efficiency mode oscillators, the current at the diode terminals 7, 9 has normally been a train of relatively short duration pulses rich in harmonic energy; accordingly, the pulsed current wave contains a component of fundamental frequency $\omega_f$, and effectively all of its harmonic spectral components $n\omega_f$, where $n = 2, 3, 4, \ldots, n$. In order to support in substantial individual amplitude this plurality of frequency components across diode 1, the circuit-diode combination of FIG. 1 must be resonant at the fundamental frequency $\omega_f$, and effectively at all harmonic frequencies $n\omega_f$, as well. In other words, the reactive part of the input impedance $Z\omega$ must be the conjugate of the diode reactance $X_D(\omega)$, where $n = 1, 2, 3, \ldots, n$.

It has been recognized that certain significant constraints must be placed upon the arbitrary FIG. 1 circuit model. Since it is generally desired of an oscillator that it produce an output signal of a predetermined single frequency, uncluttered by harmonics or other spurious signals, it is seen that the filter network 5 must efficiently pass the fundamental frequency $\omega_f$ to the utilization circuit 6, while successfully retaining all harmonic frequencies $n\omega_f$. In addition to retaining the harmonic energy, the filter circuit 6 must be of such a nature that the harmonics are not dissipated, otherwise the direct current-to-high frequency current conversion efficiency of the oscillator will be unsatisfactorily low. Thus, the real parts of the input impedance of filter 5 at each harmonic frequency must approach zero ohms.

In summary, these circuit characteristics may be realized by a properly selected low-pass filter or harmonic choke system; in any event, the real part of $Z(\omega_f)$ must equal the absolute value of the real part of $Z_D(\omega_f)$. Also, the real value of $Z(n\omega_f)$ must approach zero for $n=2, 3, 4, \ldots, n$. Further, the imaginary part of $Z(n\omega_f)$ must equal the negative value of the imaginary part of $Z_D(n\omega_f)$ for $n = 1, 2, 3, 4, \ldots, n$. The transfer function $H(n\omega_f)$ must be unity for $n = 1$ and must be zero for $n = 2, 3, 4, \ldots, n$. Such filter network circuits have been realized by the use of low pass filter systems or harmonic chokes of the general type used at times in parametric amplifier devices.

High efficiency mode diode, high frequency oscillators, in contrast to amplifiers of this type, have often been operated by use of time-delayed triggering. The fundamental character of time-delayed triggering of such oscillators is that they employ a network 5 such as modeled in FIG. 1. As in FIG. 2, the network may be located an electrical distance $\lambda/2$ from diode 1, $\lambda$ corresponding to the fundamental or output frequency $\omega_0$. Such also defines a criterion necessary for operation by time-delayed triggering, a phenomenon found in certain semiconductor diodes. A diode of the type known generally as the avalanche transit time diode is found to have characteristics suitable for use as diode 1. It may be used in the form known as the trapped plasma avalanche triggered transit diode, also known as the TRAPATT diode. For example, diode 1 may be an epitaxial silicon or other p-n or step or abrupt junction diode of a p-n-n+ punch-through diode designed such that, with an electric field of suitable amplitude present, the field punches through a substrate at reverse break down. Such diodes may, for example, be successfully formed by diffusing boron from a boron-nitride source into a phosphorous-doped epitaxial material on a heavily doped antimony substrate. The thickness of the epitaxial layer is varied by etching, prior to diffusion, so as to produce either the abrupt p-n structure or the p-n-n+ structure.

Figure 2:
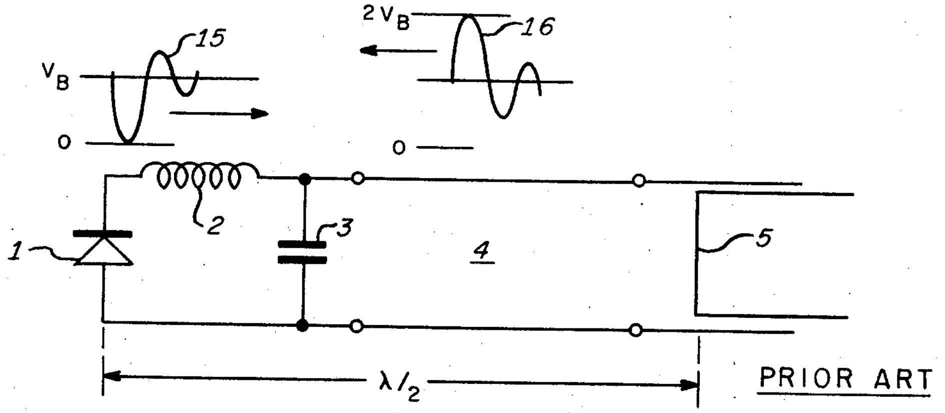
Figure 3:
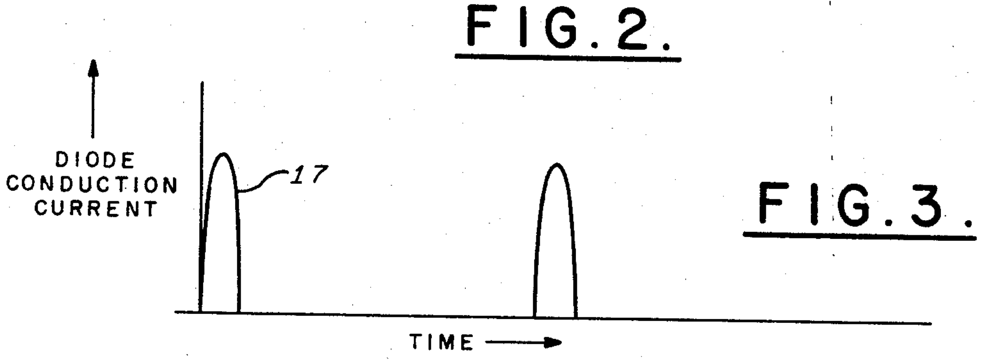
FIGS. 3 and 4 are wave form graphs useful in explaining operation of time delay triggered oscillators.

In FIG. 2, the network represented by element 5 is placed an electrical distance $\lambda/2$ at frequency $\omega_0$ from diode 1. If a suffently large transient over-voltage 17, as in FIG. 3, is applied across TRAPPAT diode 1, a traveling avalanche zone is initiated within the diode. During the time the zone passes across the depletion layer of diode 1, the diode voltage drops and the current through diode 1 sharply increases. When the avalanche shock front has completely traversed the depletion layer of diode 1, the diode voltage instantaneously drops to very nearly zero. Accordingly, a voltage step wave 15 whose magnitude is greater than the diode break down voltage is generated.

Figure 4:
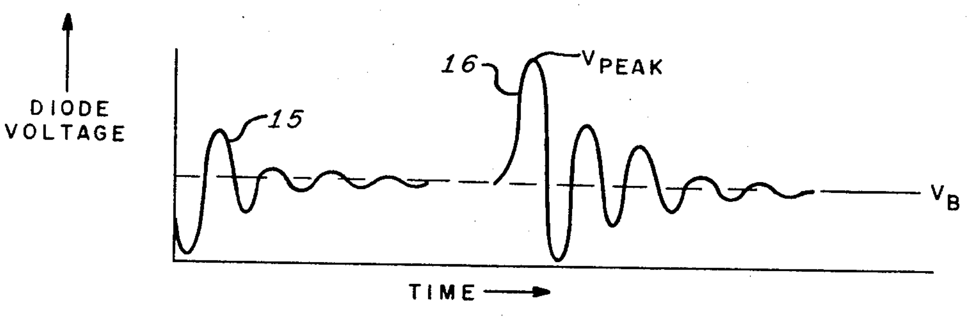

The generated step wave 15 then propagates along the $\lambda/2$ transmission line path from diode 1 to filter 5, whose high frequency impedance is very nearly that of a short circuit. At filter 5, the step voltage wave is reflected as a wave 16 having almost the same amplitude as wave 15, but being inverted in polarity (FIG. 4). The reflected step wave arrives back at diode 1 with a total time delay corresponding to one cycle at the fundamental frequency $\omega_0$. The diode 1 voltage is then automatically driven at the instant of arrival to approximately twice its break down voltage and a new avalanche is triggered in diode 1. The entire process cyclically repeats itself and is self-sustaining.

Figure 5:
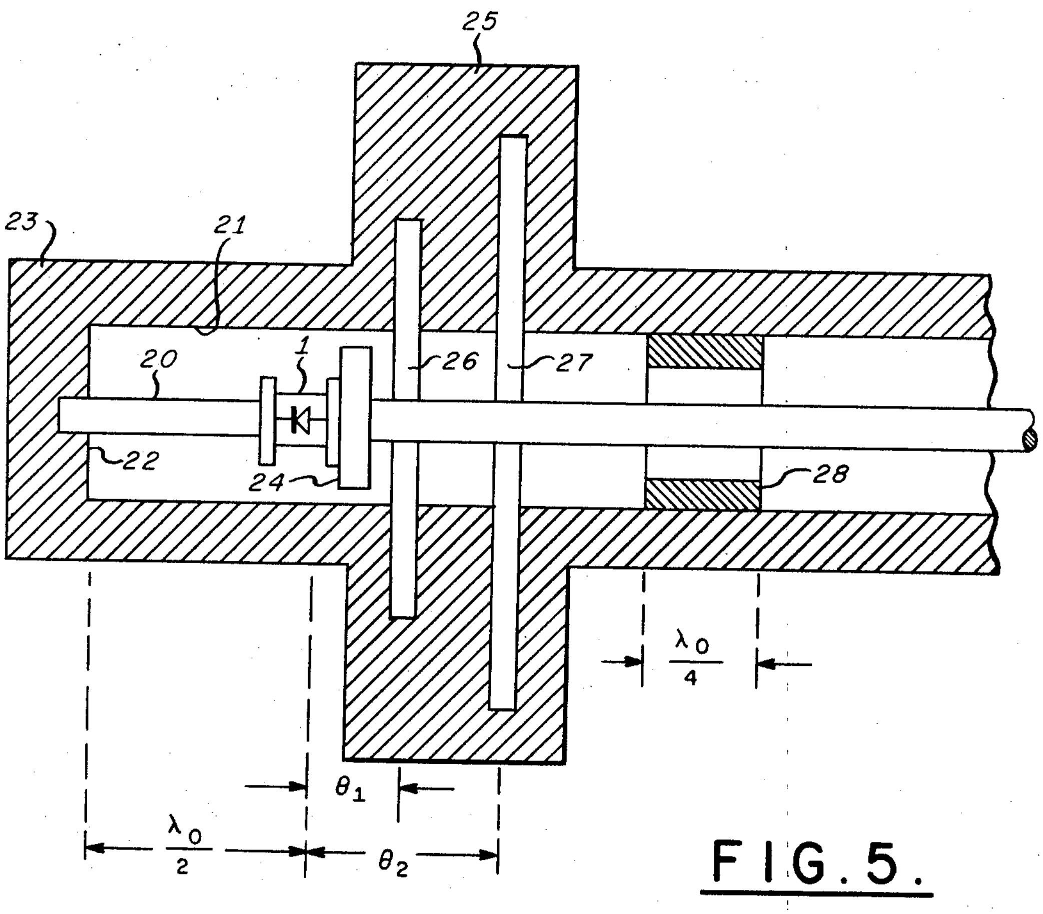
FIG. 5 is a cross section view of one form of the invention.

In FIG. 5 representation of the present invention, there is shown a novel fixed tuned, time delayed triggered oscillator having improved features over the prior art FIG. 1 and 2 configurations. It incorporates a TRAPPATT diode 1 located in the central conductor 20 of a coaxial transmission line having an outer conductor 21 concentrically surrounding inner conductor 20. Diode 1 is located in inner conductor 20 a distance $\lambda_o/2$ from the shorting surface 22 of an end wall 23, which end wall 23 supports conductor 20 within conductor 21 in high frequency current conducting relation. At the side of diode 1 opposite shorting surface 22, a conducting disk capacitor 24 is inserted in shunt with the center conductor 20, which conductor extends to the right in the drawing to an output for the diode (not shown) and may be additionally supported in place by conventional dielectric support elements (not shown) in the conventional manner. Outer conductor 21 may be similarly extended. A conventional bias tee (not shown) may be connected in the output of the oscillator to supply the necessary bias voltage across diode 1, as described in the M.I. Grace patent application, Ser. No. 17,673, filed Mar. 9, 1970, for a "Semi-Conductor High Frequency Signal Generator", issued Feb. 29, 1972 as U.S. Pat. No. 3,646,581.

An enlarged section 25 is supplied in the wall of the outer conductor 21 beginning, for example, at about the interface between diode 1 and disk capacitor 24. A first radial transmission line 26 operating as a harmonic choke is cut within extension 25 at a distance $\theta$ from diode 1. Likewise, a second radial transmission line 27 operating as a harmonic choke is cut within extension 25 at a distance $\theta_2$ from diode 1. Within the portion of radial transmission line 27 remote from diode 1, an apertured ring-shaped $\lambda_o/4$ length impedance matching transformer 28 is provided which may be adjustably positioned within coaxial line 20, 21 in any conventional manner. The parameter $\lambda_o$ is the wave length corresponding to the fundamental or output frequency $\omega_o$.

Figure 6:
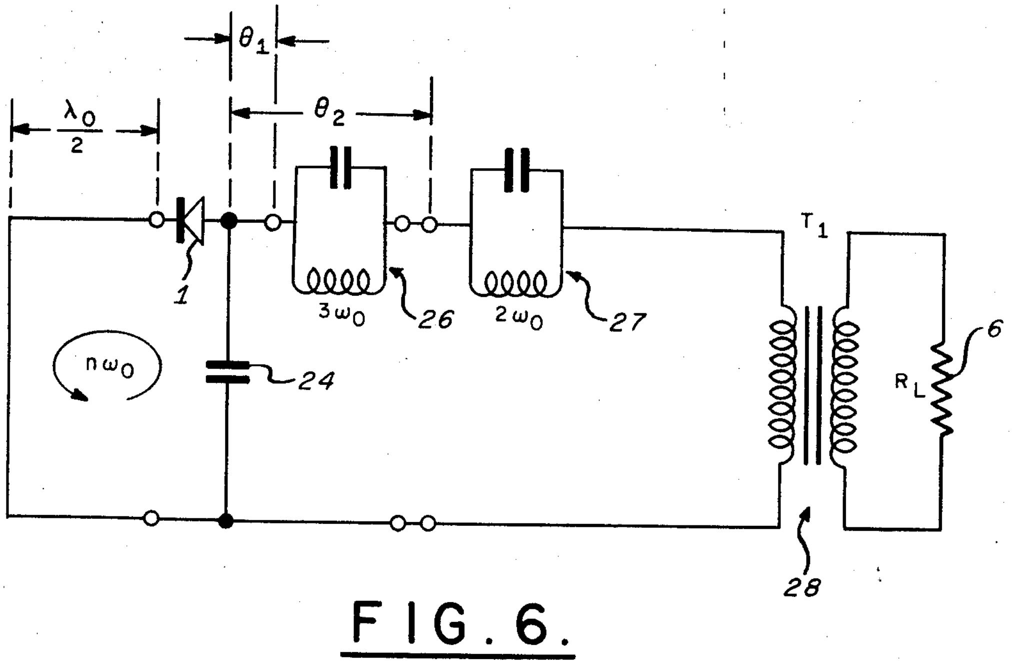
FIG. 6 is a circuit equivalent to that of FIG. 5.

The functions of the circuit elements of FIG. 5 may be explained from the model shown in FIG. 6, though it must be observed that the model of FIG. 6 again suffers because it cannot truly represent the distributed circuit of FIG. 5, especially over the regime of frequencies represented by the span of harmonic operating frequencies involved. As noted in connection with FIG. 5, the length of the shorted transmission line to the left of diode 1 is $\lambda_o/2$, the value needed for supplying the reflecting path required for time delayed triggering operation of diode 1.

The radial transmission line harmonic chokes 26 and 27 are of the series kind and are so constructed and arranged that each presents an open circuit in series with the center conductor 20 at the desired harmonic frequencies $n\omega_o$. The third harmonic choke 26 is placed an electrical distance $\theta_1$ from the terminals of diode 1 so that the diode 1 is series resonant at the third harmonic. The second harmonic radial transmission line choke 27 is placed an electrical length $\theta_2$ from the terminals of diode 1, so that diode 1 is series resonant also at the second harmonic. The harmonic chokes 26 and 27 confine the harmonic currents to the region enveloping diode 1, preventing any possibility of dissipation of such harmonic energy in load 6. The disk capacitor 24 plays the important role at the terminals of diode 1 of presenting a very low impedance to all harmonic power of frequency greater than the third harmonic.

The interior sleeve-like impedance matching structure 28 is made $\lambda_o/4$ long at the carrier frequency $\omega_o$ and is selected and positioned within coaxial line 20, 21 so as to reflect the proper load impedance at diode 1 such that the maximum efficiency of energy transfer is achieved, as well as maximum power output at frequency $\omega_o$. At the harmonic frequencies $2\omega_o$, $3\omega_o$ . . . , $n\omega_o$, the radial transmission line chokes 26, 27 present a low impedance at diode 1. The circuit therefore has the desired characteristic of the idealized circuit of FIG. 1 with the input impedance $Z_i(n\omega_o) = 0$, where $n$ is 2, 3, . . . , $n$, and all harmonic currents flow through diode 1 to afford the desired pulsed wave 17 of FIG. 3.

Figure 7:
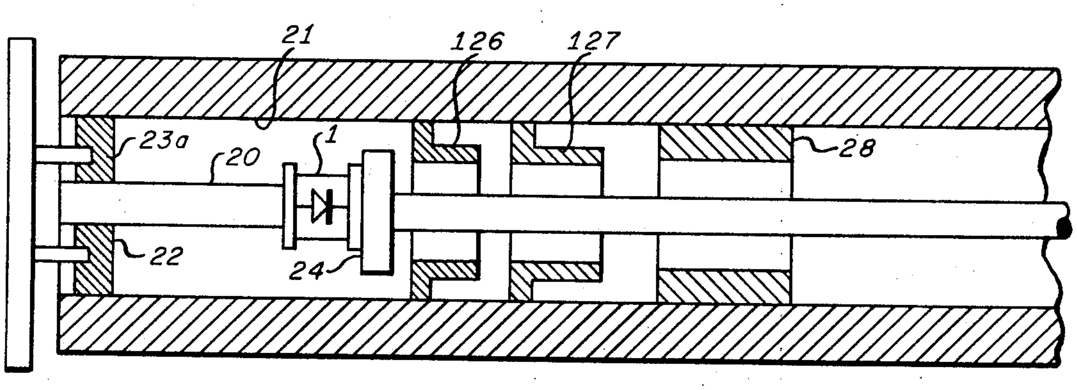
FIG. 7 is a cross section view of an alternative form of FIG. 5.

The invention may also be practiced in the form shown in FIG. 7, wherein reference numerals corresponding to those used in FIG. 5 are used for corresponding parts, such as for diode 1, coaxial line elements 20 and 21, the end wall surface 22, disk capacitor 24, and quarter wave impedance matching transformer 28. The surface 22 appears on an end wall **23*a* made non-integral with coaxial line elements 20, 21 so that surface 22** may be moved for precise adjustment purposes.

Figure 8:
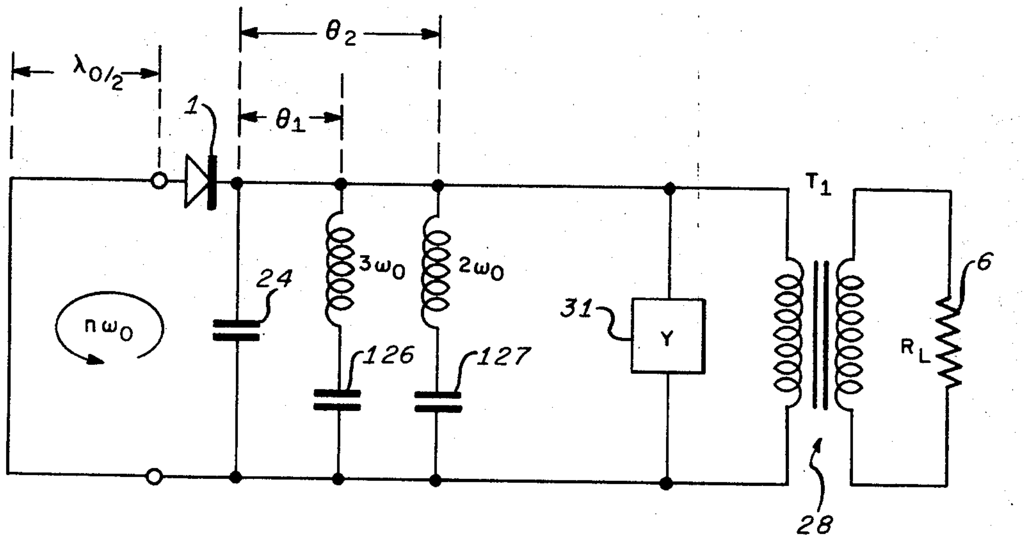
FIG. 8 is a circuit equivalent to that of FIG. 7.

The device of FIG. 7 is similar in principle to that of FIG. 5, but uses folded choke devices 126, 127 having the shunt characteristics illustrated in the equivalent circuit of FIG. 8. It will be observed that the use of the shunt harmonic chokes 126, 127 in place of the series harmonic chokes of FIG. 5 modifies the equivalent circuit somewhat. The admittance $\lambda$ at location 31 represents the total equivalent circuit of the $\lambda_o/4$ transformer 28 used to resonate diode 1 at the fundamental output frequency. In addition to the advantages found in the form of the invention shown in FIG. 5, the FIG. 7 device benefits because folded chokes 126, 127 are more readily adjusted to a position affording optimum performance of the apparatus.

Such oscillators have been used to generate high frequency pulses of as much as 60 watts pulse power at 4.3 GHz. As expected, the operational frequency is mainly determined by the $\lambda_o/2$ length of the transmission line to the left of diode 1 and closed by shorting surface 22. Movement of surface 22 therefore provides an essentially independent frequency adjustment. The novel oscillators have demonstrated pulsed operation with the leading edge jitter being much less than in conventional time delay triggered oscillators of the type discussed in connection with FIGS. 1 and 2. For example, pulse jitter has been reduced from values as great as ±25 nanoseconds to less than ±5 nanoseconds. It will be appreciated, of course, that best results are attained by using materials that are highly conducting for high frequency currents wherever the material forming the structures is exposed to high frequency fields. The conducting surfaces, for example, of the coaxial line elements 20, 21, of wall 23, of chokes 26, 27, 126, 127, and of matching transformer 28 are formed of or coated with a good high frequency current conducting material, such as gold or silver. FIGS. 5 and 7 have been made with a view of making the drawings clear and therefore do not necessarily show proportions which would be used in actual practice.

While the invention has been described in its preferred embodiments, it is to be understood that the words which have been used are words of description rather than of limitation and that changes within the purview of the appended claims may be made without departure from the true scope and spirit of the invention in its broader aspects.

We claim:

1. A high frequency energy converter adapted to be coupled to utilization means comprising:

transmission line means having first and second high frequency conductor means, conductive shorting means for mutually connecting said high frequency conductor means at one end of said transmission line means, semiconductor diode means shunt connected to capacitive means in said first high frequency conductor means, said diode means being centered at a distance substantially $\lambda/2$ from said shorting means, where $\lambda$ is the operating fundamental wave length of said energy converter, third-harmonic choke means conductively associated with said transmission line means located substantially at a distance from said diode means such that said diode means is made series resonant thereby at said third harmonic, second-harmonic choke means conductively associated with said transmission line means located substantially at a distance from said diode means such that said diode means is made series resonant thereby at said second harmonic, and impedance matching means spaced in said transmission line means from said second harmonic choke means opposite said third harmonic choke means for matching said energy converter to said utilization means for efficient transfer of said fundamental wave length energy thereto.

2. Apparatus as described in claim 1 wherein said capacitive means is directly connected at said diode means.

3. Apparatus as described in claim 2 wherein said diode means comprises trapped plasma avalanche triggered transit diode means.

4. Apparatus as described in claim 2 wherein harmonic choke means comprises spaced resonant circuit means in series relation with said transmission line means.

5. Apparatus as described in claim 2 wherein said harmonic choke means comprises spaced resonant circuit means in shunt relation with said transmission line means.

6. Apparatus as described in claim 2 wherein said harmonic choke means comprises spaced radial transmission line means coupled in branching relation within said second high frequency conductor means.

7. Apparatus as described in claim 2 wherein said harmonic choke means comprises spaced folded choke means in conductive contact with said second high frequency conductor means.

8. Apparatus as described in claim 3 wherein said impedance matching means comprises a quarter wave length impedance discontinuity in conductive relation with said second high frequency conductor means.

* * * * *